United States Patent
Ikeue

(10) Patent No.: US 12,062,569 B2
(45) Date of Patent: Aug. 13, 2024

(54) PROCESSING APPARATUS AND PROCESSING METHOD

(71) Applicant: Tokyo Electron Limited, Tokyo (JP)

(72) Inventor: Kazuya Ikeue, Kumamoto (JP)

(73) Assignee: Tokyo Electron Limited, Tokyo (JP)

( * ) Notice: Subject to any disclaimer, the term of this patent is extended or adjusted under 35 U.S.C. 154(b) by 244 days.

(21) Appl. No.: 17/425,342

(22) PCT Filed: Jan. 16, 2020

(86) PCT No.: PCT/JP2020/001241
§ 371 (c)(1),
(2) Date: Jul. 23, 2021

(87) PCT Pub. No.: WO2020/153219
PCT Pub. Date: Jul. 30, 2020

(65) Prior Publication Data
US 2022/0093446 A1 Mar. 24, 2022

(30) Foreign Application Priority Data

Jan. 24, 2019 (JP) .................................. 2019-010504

(51) Int. Cl.
*H01L 21/687* (2006.01)
*H01L 21/67* (2006.01)

(52) U.S. Cl.
CPC .. *H01L 21/68735* (2013.01); *H01L 21/67051* (2013.01); *H01L 21/67259* (2013.01); *H01L 21/68764* (2013.01)

(58) Field of Classification Search
None
See application file for complete search history.

(56) References Cited

U.S. PATENT DOCUMENTS

| | | | |
|---|---|---|---|
| 5,545,076 A * | 8/1996 | Yun | B24B 7/228 438/959 |
| 6,398,975 B1 * | 6/2002 | Mertens | H01L 21/67051 134/36 |
| 2012/0180813 A1 * | 7/2012 | Peng | H01L 21/67028 15/210.1 |

FOREIGN PATENT DOCUMENTS

| JP | 2002-124501 A | 4/2002 |
|---|---|---|
| JP | 2003-045845 A | 2/2003 |
| JP | 2013-215868 A | 10/2013 |
| JP | 2015199158 A | 11/2015 |

(Continued)

OTHER PUBLICATIONS

Translation of JP2003045845A (Year: 2023).*
International Search Report of PCT/JP2020/001241 dated Apr. 7, 2020, 6 pages.

*Primary Examiner* — Eric W Golightly
(74) *Attorney, Agent, or Firm* — Shih IP Law Group, PLLC.

(57) ABSTRACT

A processing apparatus configured to process a substrate includes a substrate holder having a substrate holding surface configured to attract and hold the substrate thereon; and an edge cleaning device configured to clean an edge portion of the substrate holding surface. Further, a processing method of processing a rear surface of the substrate by using the processing apparatus includes processing the rear surface of the substrate while a front surface of the substrate is attracted to and held by a substrate holding surface of a substrate holder; and cleaning an edge portion of the substrate holding surface.

7 Claims, 9 Drawing Sheets

(56) References Cited

FOREIGN PATENT DOCUMENTS

| JP | 2018111146 A | 7/2018 |
|----|--------------|--------|
| KR | 1020060133208 A | 12/2006 |

* cited by examiner

*Prior Art*

*Prior Art*

US 12,062,569 B2

PROCESSING APPARATUS AND PROCESSING METHOD

CROSS-REFERENCE TO RELATED APPLICATIONS

This Application is a U.S. national phase application under 35 U.S.C. § 371 of PCT Application No. PCT/JP2020/001241 filed on Jan. 16, 2020, which claims the benefit of Japanese Patent Application No. 2019-010504 filed on Jan. 24, 2019, the entire disclosures of which are incorporated herein by reference.

TECHNICAL FIELD

The various aspects and embodiments described herein pertain generally to a processing apparatus and a processing method.

BACKGROUND

Patent Document 1 discloses a chuck table equipped with a holder serving as a holding surface for attracting and holding a plate-shaped workpiece thereon; a base member supporting the holder; and a water seal surface formed as a part of a top surface of the base member at a peripheral side of the holder. In this chuck table, a water seal portion is formed by supplying water into a gap between the water seal surface and a bottom surface of the plate-shaped workpiece attracted to and held by the holder. Accordingly, processing water including a processing debris is suppressed from reaching the bottom surface of the plate-shaped workpiece.

PRIOR ART DOCUMENT

Patent Document 1: Japanese Patent Laid-open Publication No. 2013-215868

DISCLOSURE OF THE INVENTION

Means for Solving the Problems

In an exemplary embodiment, a processing apparatus configured to process a substrate includes a substrate holder having a substrate holding surface configured to attract and hold the substrate thereon; and an edge cleaning device configured to clean an edge portion of the substrate holding surface.

DETAILED DESCRIPTION

In a manufacturing process for a semiconductor device, a semiconductor wafer (hereinafter, simply referred to as "wafer") as a substrate having a plurality of devices such as electronic circuits on a front surface thereof is thinned by grinding a rear surface of this wafer.

Figure 1A:
FIG. 1A and FIG. 1B are a side view and a plan view illustrating a schematic structure of a wafer to be processed in a processing apparatus, respectively.
Figure 1B:
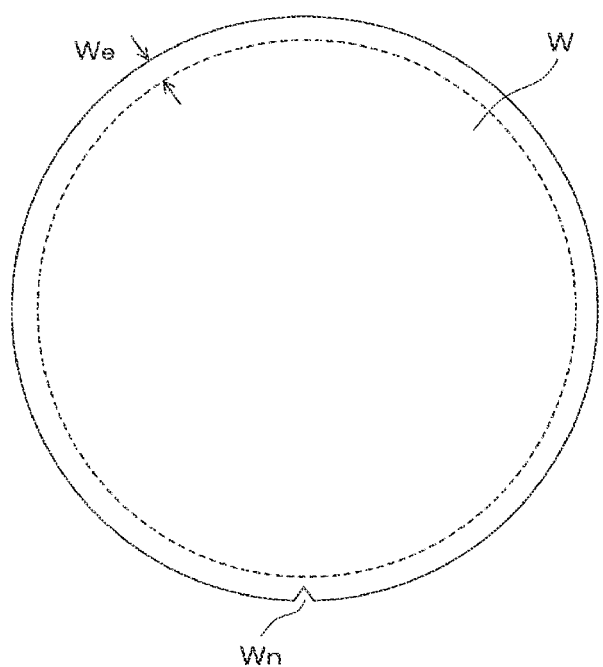

FIG. 1A and FIG. 1B are explanatory diagrams schematically illustrating a structure of a wafer W to be processed in a processing apparatus 1 to be described later. FIG. 1A is a side view thereof, and FIG. 1B is a plan view thereof. The wafer W is, for example, a semiconductor wafer such as, but not limited to, a silicon wafer or a compound semiconductor wafer, and a device (not shown) is formed on a front surface Wa of the wafer W.

As depicted in FIG. 1A, a peripheral portion We of the wafer W is chamfered, and a thickness of the peripheral portion We (for example, ranging from, e.g., 0.2 mm to 0.6 mm from an edge of the wafer W in a diametrical direction thereof) decreases toward a leading end thereof on a cross section thereof. Further, as illustrated in FIG. 1B, a notch Wn for specifying a position of the wafer W within the processing apparatus 1 in a rotation direction thereof is formed at the peripheral portion We of the wafer W, for example, in a substantially V-shape, when viewed from the top.

Further, as an example of a protection member (not shown) for protecting the device, a protection tape or a support wafer may be attached to the front surface Wa of the wafer W.

In the processing apparatus 1, grinding of a rear surface Wb of the wafer W is performed, for example. The grinding in this processing apparatus 1 is performed in the state that the wafer W is attracted to and held on a chuck table, as described in Patent Document 1.

Here, as depicted in FIG. 1A and FIG. 1B, the peripheral portion We of the wafer W is chamfered, and the notch Wn is formed at the peripheral portion We.

Figure 2A:
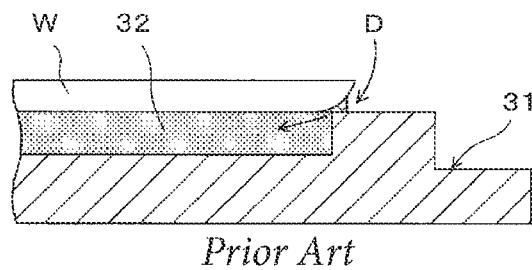
FIG. 2A and FIG. 2B are explanatory diagrams for describing a reason for TTV deterioration in the processing apparatus.

If the grinding of the wafer W having the above-stated structure is performed, a grinding debris D generated in the grinding processing may reach a gap (hereinafter, sometimes referred to as "an edge portion of a substrate holding surface") between the peripheral portion We and a substrate holder 31 to be described later to be deposited, as illustrated in FIG. 2A, as a cleaning liquid including the grinding debris D stays thereat. Particularly, this grinding debris D may reach the edge portion of the substrate holding surface corresponding to a position where the notch Wn is formed, and deposited thereat. Furthermore, the deposited grinding debris D may sometimes be introduced into a porous member 32 serving as a substrate attracting member.

In general, the substrate holder 31 is cleaned by a cleaning device provided in the processing apparatus 1 to clean the substrate holder 31.

Figure 2B:
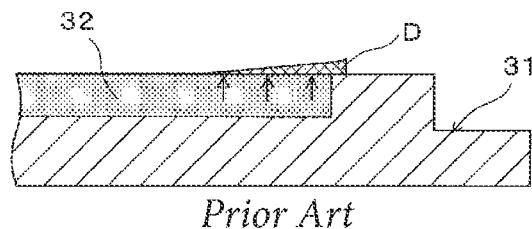

At this time, by blowing water and air at the same time from an attraction surface of the porous member 32, as shown in FIG. 2B, the grinding debris D introduced into the porous member 32 is discharged out, so that the inside of the porous member 32 is cleaned.

Figure 3A:
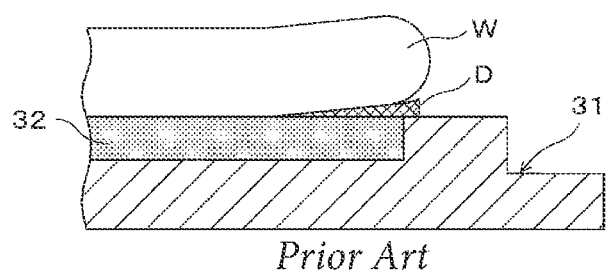
FIG. 3A and FIG. 3B are explanatory diagrams for describing the reason for TTV deterioration in the processing apparatus.
Figure 3B:
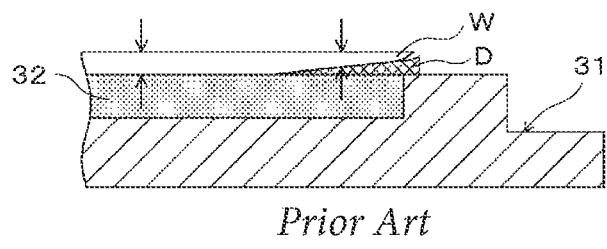

If, however, there remains the grinding debris D which is not completely removed by the cleaning of the substrate holder 31, particularly, if there remains the grinding debris D deposited in the notch portion Wn, a wafer W to be processed next may be put on the deposited grinding debris D, as shown in FIG. 3A. If the grinding is performed in the state that the wafer W is placed on the grinding debris D, a portion of the wafer W put on the grinding debris D may be given a smaller thickness as shown in FIG. 3B, which may result in deterioration of TTV (Total Thickness Variation).

In the aforementioned Patent Document 1, adhesion of the processing debris to the rear surface of the plate-shaped workpiece, which might be caused as the processing water reaches the gap between the plate-shaped workpiece and the base member of the chuck table, is suppressed by forming the water seal portion on the base member. In this prior art, however, the deterioration of TTV encountered as the processing debris reaches the gap between the plate-shaped workpiece and the holder of the chuck table is not taken into account. In this regard, there is still a room for improvement in the conventional grinding processing.

In view of the foregoing, the present disclosure provides a technique capable of appropriately removing the grinding debris deposited on the substrate holding surface, thus improving the in-surface uniformity of the thickness of the substrate after being ground. To elaborate, the processing apparatus 1 is equipped with a dedicated cleaning device configured to clean the grinding debris D. Hereinafter, a processing apparatus and a processing method according to an exemplary embodiment will be described with the accompanying drawings. In the present specification and the drawings, parts having substantially same functions and configurations will be assigned same reference numerals, and redundant description will be omitted.

Configuration of Processing Apparatus According to Exemplary Embodiment

Figure 4:
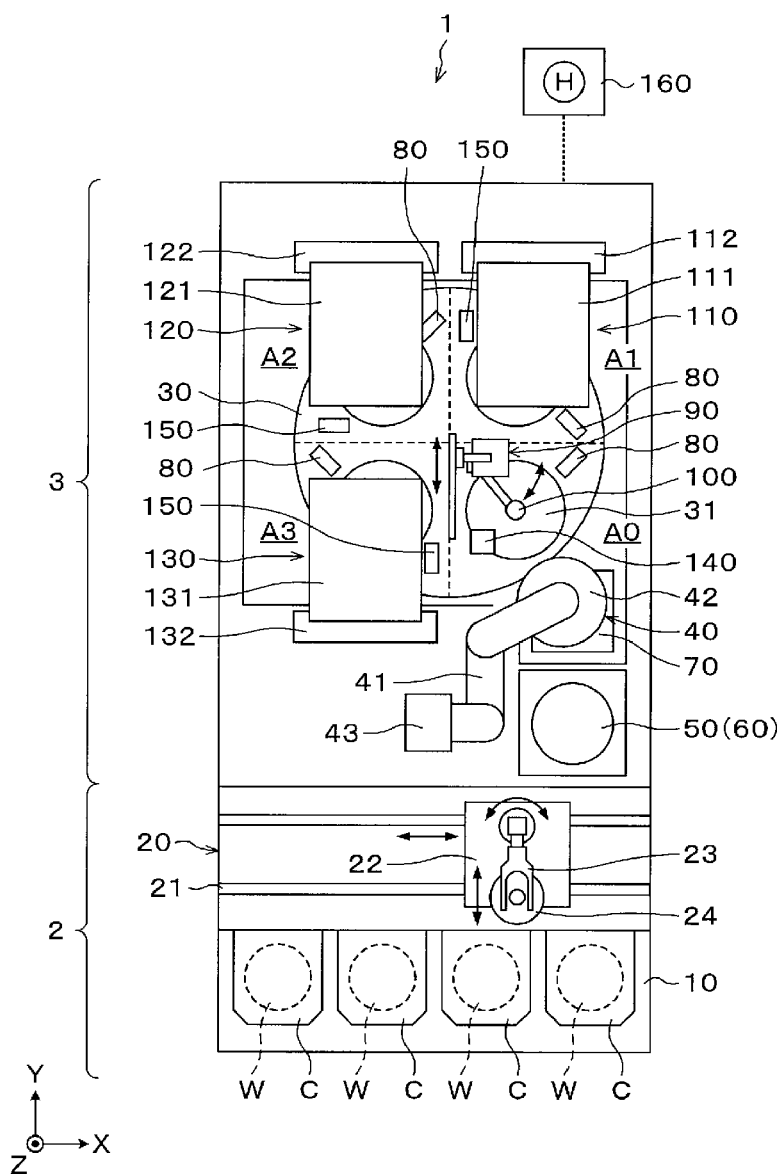
FIG. 4 is a plan view illustrating a schematic configuration of a processing apparatus according to an exemplary embodiment.

First, a configuration of the processing apparatus according to the present exemplary embodiment will be described. FIG. 4 is a plan view illustrating a schematic configuration of the processing apparatus 1.

As shown in FIG. 4, the processing apparatus 1 includes a carry-in/out station 2 in which a cassette C capable of accommodating therein a multiple number of wafers W is carried to/from, for example, an outside; and a processing station 3 configured to perform a preset processing on the wafers W. The carry-in/out station 3 and the processing station 3 are connected as one body. The carry-in/out station 2 and the processing station 3 are arranged side by side in the Y-axis direction.

The carry-in/out station 2 is equipped with a cassette placing table 10. In the shown example, a plurality of, for example, four cassette placing tables 10 are arranged in a row in the X-axis direction. That is, four cassettes C can be arranged in a row in the X-axis direction.

Further, the carry-in/out station 2 includes a wafer transfer section 20 provided adjacent to, for example, the positive Y-axis side of the cassette placing table 10. A wafer transfer device 22 configured to be moved on a transfer path 21 elongated in the X-axis direction is provided in the wafer transfer section 20. The wafer transfer device 22 is equipped with a transfer fork 23 and a transfer pad 24. A leading end of the transfer fork 23 is bifurcated to attract and hold the wafer W thereon. The transfer fork 23 serves to transfer, for example, the wafer W before being ground. The transfer pad 24 has a circular shape having a diameter larger than a diameter of the wafer W when viewed from the top, and is configured to attract and hold the wafer W. The transfer pad 24 serves to transfer, for example, the wafer W after being ground. Each of the transfer fork 23 and the transfer pad 24 is configured to be moved in a horizontal direction and a vertical direction and pivotable around a horizontal axis and a vertical axis.

In the processing station 3, processings such as grinding and cleaning are performed on the wafer W consecutively. The processing station 3 is equipped with a rotary table 30; a transfer unit 40; an alignment unit 50; a first cleaning unit 60; a second cleaning unit 70; wafer cleaning units 80 as an entire surface cleaning device or a cleaning liquid supply; a chuck cleaning unit 90 as a holder entire surface cleaning device; a thickness measuring unit 100; a rough grinding unit 110; an intermediate grinding unit 120; and a finishing grinding unit 130. Further, the processing apparatus 1 according to the present exemplary embodiment is further equipped with a first edge cleaning unit 140 as an edge cleaning device and second edge cleaning units 150 as the edge cleaning device.

The rotary table 30 is configured to be rotated by a rotating mechanism (not shown). Four substrate holders 31 each of which has a substrate holding surface 31a for attracting and holding the wafer W are disposed on the rotary table 30. These substrate holders 31 are arranged on a single circle on the rotary table 30 at a regular distance therebetween, that is, an angular distance of 90 degrees therebetween. The four substrate holders 31 can be moved to a delivery position A0 and first to third processing positions A1 to A3 as the rotary table 30 is rotated.

As shown in FIG. 4, the delivery position A0 is a position at the positive X-axis and negative Y-axis side of the rotary table 30, and the wafer cleaning unit 80, the chuck cleaning unit 90, the thickness measuring unit 100, and the first edge cleaning unit 140 are disposed thereat. The second cleaning unit 70, the alignment unit 50 and the first cleaning unit 60 are arranged at the negative Y-axis side of the delivery position A0. The alignment unit 50 and the first cleaning unit 60 are stacked on top of each other in this sequence from the top. The first processing position A1 is a position at the positive X-axis and positive Y-axis side of the rotary table 30, and the wafer cleaning unit 80, the rough grinding unit 110, and the second edge cleaning unit 150 are disposed thereat. The second processing position A2 is a position at the negative X-axis and positive Y-axis side of the rotary table 30, and the wafer cleaning unit 80, the intermediate grinding unit 120, and the second edge cleaning unit 150 are disposed thereat. The third processing position A3 is a position at the negative X-axis and negative Y-axis side of the rotary table 30, and the wafer cleaning unit 80, the finishing grinding unit 130, and the second edge cleaning unit 150 are disposed thereat.

Figure 5:
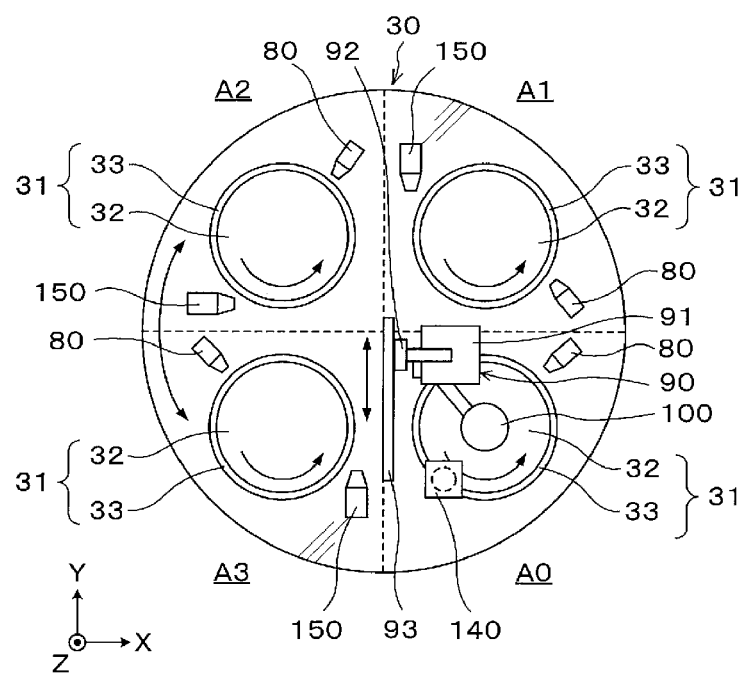
FIG. 5 is a plan view illustrating a schematic configuration of a substrate holder.
Figure 6:
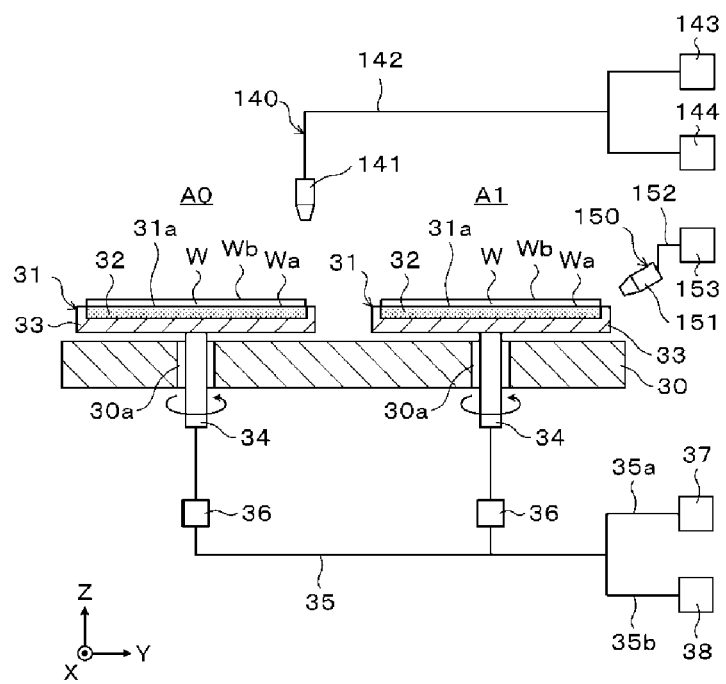
FIG. 6 is a cross sectional view illustrating the schematic configuration of the substrate holder.
Figure 7:
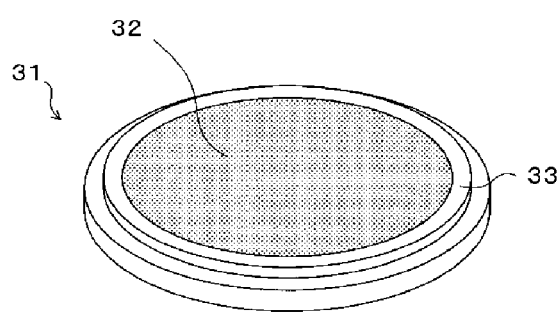
FIG. 7 is a perspective view illustrating the schematic configuration of the substrate holder.

FIG. 5 to FIG. 7 are explanatory diagrams illustrating a schematic configuration of the substrate holder 31. FIG. 5 is a plan view thereof; FIG. 6, a cross sectional view thereof; and FIG. 7, a perspective view thereof.

The substrate holder 31 is equipped with a porous member 32 as a substrate attracting member; and a chuck base 33 as a support configured to support the porous member 32 from below it. In this way, the substrate holder 31 is configured as a porous chuck, for example. Further, the chuck base 33 is made of, for example, a ceramic.

As shown in FIG. 6, the substrate holder 31 is configured to be rotated by a rotating mechanism 34. The rotating mechanism 34 is inserted through, for example, a through hole 30a formed through the rotary table 30.

The substrate holder 31 is connected with a supply line 35 through which at least a liquid or a gas is supplied to the substrate holding surface 31a. The supply line 35 is connected to the substrate holder 31 through the inside of the rotating mechanism 34. This supply line 35 is connected to each of the four substrate holders 31. The supply line 35 is equipped with valves 36 each of which is configured to control a supply of the liquid or the gas to corresponding one of the substrate holders 31. Further, the supply line 35 is branched into a liquid supply line 35a and a gas supply line 35b at a downstream side. The liquid supply line 35a is connected with a liquid supply 37. The liquid supply 37 stores therein the liquid, for example, pure water, and supplies this liquid to the substrate holding surface 31a. The gas supply line 35b is connected with a gas supply 38. The gas supply 38 stores therein the gas, for example, air or an inert gas, and supplies this gas to the substrate holding surface 31a.

In the present exemplary embodiment, though the liquid supply 37 and the gas supply 38 share the supply line 35, it may be possible to connect the liquid supply line 35a and the gas supply line 35b to the substrate holder 31 directly. In such a case, each of the liquid supply line 35a and the gas supply line 35b is provided with a valve (not shown). Further, in the present exemplary embodiment, though the liquid supply 37 and the gas supply 38 are shared by the four substrate holders 31, each of the substrate holders 31 may have the liquid supply 37 and the gas supply 38, individually.

As shown in FIG. 4 to FIG. 6, the first edge cleaning unit 140 is disposed above an edge portion of the substrate holding surface 31a at the delivery position A0. The first edge cleaning unit 140 is equipped with a nozzle 141 configured to supply a dual-fluid cleaning liquid as a mixture of a liquid and a gas, for example, a mixture of pure water and air or the inert gas. The nozzle 141 is connected to a liquid supply 143 and a gas supply 144 via a supply line 142.

Further, the configuration of the first edge cleaning unit 140 is not limited thereto. By way of example, a high-pressure cleaning nozzle or a cleaning brush may be used instead of the dual-fluid nozzle as stated above. Furthermore, any one of combinations of these nozzles and the cleaning brush may be provided in the processing apparatus 1.

As depicted in FIG. 4 to FIG. 6, the second edge cleaning unit 150 is provided at an outside of the substrate holder 31 at the first processing position A1 in a diametrical direction thereof. The second edge cleaning unit 150 is equipped with a nozzle 151 configured to supply a liquid, for example, pure water toward the edge portion of the substrate holding surface 31a. The nozzle 151 is connected to a liquid supply 153 via a supply line 152.

The second processing position A2 and the third processing position A3 has the same layout as the first processing position A1. That is, the second edge cleaning unit 150 is provided at each of the second processing position A2 and the third processing position A3, as shown in FIG. 4. Further, in the present exemplary embodiment, the liquid supply 153 is provided at each of the processing positions A1 to A3 individually. However, a common liquid supply 153 may be provided for the processing positions A1 to A3, and supplies of the liquid to the respective processing positions A1 to A3 may be controlled by valves (not shown).

Referring back to FIG. 4, the transfer unit 40 is a multi-joint robot equipped with a plurality of, for example, three arms 41. The three arms 41 are configured to be pivotable. The arm 41 provided at a leading end thereof is equipped with a transfer pad 42 configured to attract and hold the wafer W. The arm 41 provided at a base end thereof is mounted to an elevating mechanism 43 configured to move the arm 41 up and down in the vertical direction. The transfer unit 40 having this configuration is capable of transfer the wafer W to/from the delivery position A0, the alignment unit 50, the first cleaning unit 60 and the second cleaning unit 70.

In the alignment unit 50, a direction of the wafer W before being subjected to a grinding processing in the horizontal direction is adjusted. To elaborate, while rotating the wafer W held by, for example, a spin chuck (not shown), a position of the notch Wn of the wafer W is detected by a detector (not shown). Then, by adjusting the position of the notch Wn, the direction of the wafer W in the horizontal direction is adjusted.

In the first cleaning unit 60, the rear surface Wb of the wafer W after being subjected to the grinding processing is cleaned. Specifically, the rear surface Wb is spin-cleaned.

In the second cleaning unit 70, in the state that the wafer W after being subjected to the grinding processing is held by the transfer pad 42, the front surface Wa of the wafer W is cleaned. Further, the transfer pad 42 is also cleaned.

The wafer cleaning units 80 clean the rear surface Wb of the wafer W being ground at the processing positions A1 to A3 and the rear surface Wb of the wafer W after being ground at the delivery position A0.

The chuck cleaning unit 90 is configured to clean the substrate holder 31 at the delivery position A0. As shown in FIG. 5, the chuck cleaning unit 90 includes a stone cleaning tool 91 and a moving mechanism 92. The moving mechanism 92 is configured to be moved along a slider 93 in the Y-axis direction, and to move the stone cleaning tool 91 in the X-axis direction and the Z-axis direction.

The cleaning tool provided in the chuck cleaning unit 90 may not be limited to the stone cleaning tool 91. By way of example, a brush, a high-pressure cleaning liquid supply nozzle, a dual-fluid cleaning liquid nozzle, or the like may be used instead.

The thickness measuring device 100 is configured to measure, at the delivery position A0, a thickness of the wafer W after being ground. The thickness measuring device 100 may be, by way of non-limiting example, a non-contact type laser displacement sensor. The thickness measuring unit 100 is configured to be moved between a measurement position and a standby position by a non-illustrated moving mechanism.

The rough grinding unit 110 is configured to grind the rear surface Wb of the wafer W roughly. The rough grinding unit 110 has a rough grinder 111 which is equipped with a rough grinding whetstone (not shown) configured to be rotated in a ring shape. Further, the rough grinder 111 is configured to be moved in the vertical direction and the horizontal direction along a supporting column 112. By respectively rotating the substrate holder 31 and the rough grinding whetstone while keeping the rear surface Wb of the wafer W held by the substrate holder 31 in contact with the rough grinding whetstone, and, also, by lowering the rough grinding whetstone, the rear surface Wb of the wafer W is roughly ground.

The intermediate grinding unit 120 is configured to grind the rear surface Wb of the wafer W to a medium level. The intermediate grinding unit 120 includes an intermediate grinder 121 which is equipped with an intermediate grinding whetstone (not shown) configured to be rotated in a ring shape. Further, the intermediate grinder 121 is configured to be moved in the vertical direction and the horizontal direction along a supporting column 122. Here, a particle size of abrasive grains of the intermediate grinding whetstone is smaller than a particle size of abrasive grains of the rough grinding whetstone. By respectively rotating the substrate holder 31 and the intermediate grinding whetstone while keeping the rear surface Wb of the wafer W held by the substrate holder 31 in contact with the intermediate grinding whetstone, the rear surface Wb is ground to the medium level.

The finishing grinding unit 130 is configured to grind the rear surface Wb of the wafer W finely. The finishing grinding unit 130 includes a finishing grinder 131 which is equipped with a finishing grinding whetstone (not shown) configured to be rotated in a ring shape. Further, the finishing grinder 131 is configured to be moved in the vertical direction and the horizontal direction along a supporting column 132. In addition, a particle size of abrasive grains of the finishing grinding whetstone is smaller than the particle size of the abrasive grains of the intermediate grinding whetstone. By respectively rotating the substrate holder 31 and the finishing grinding whetstone while keeping the rear surface Wb of the wafer W held by the substrate holder 31 in contact with the finishing grinding whetstone, and, also, by lowering the finishing grinding whetstone, the rear surface Wb is finely ground.

The first edge cleaning unit 140 is configured to clean the substrate holder 31 after the grinding processing on the wafer W. To be more specific, in the first edge cleaning unit 140, a grinding debris D introduced into and deposited at the edge portion of the substrate holding surface 31a between the peripheral portion We and the porous member 32 by the grinding of the wafer W is washed away.

The second edge cleaning unit 150 is configured to clean the substrate holder 31 during the grinding processing on the wafer W. To be more specific, in the second edge cleaning unit 150, the grinding debris D likely to be introduced into and deposited at the edge portion of the substrate holding surface 31a between the peripheral portion We and the porous member 32 is washed away.

The processing apparatus 1 is equipped with a controller 160. The controller 160 is, for example, a computer, and includes a program storage (not shown). The program storage stores therein a program for controlling the processing of the wafer W in the processing apparatus. Further, the program storage also stores therein a program for implementing a processing to be described later in the processing apparatus by controlling the above-stated various processing units and a driving system such as the transfer devices. Further, the programs may be recorded in a computer-readable recording medium H, and may be installed from this recording medium H to the controller 160.

Processing According to Exemplary Embodiment

Now, a processing performed in the processing apparatus 1 configured as described above will be explained with reference to a flowchart of FIG. 8.

First, a cassette C accommodating therein a multiple number of wafers W is placed on the cassette placing table 10 of the carry-in/out station 2. In the cassette C, the wafers W are accommodated with the front surfaces Wa thereof facing upwards.

Then, the wafer W is taken out of the cassette C by the transfer fork 23 of the wafer transfer device 22, and transferred into the processing station 3. At this time, the front surface Wa and the rear surface Wb of the wafer W are inverted by the transfer fork 23 such that the rear surface Wb of the wafer W faces upwards.

The wafer W transferred into the processing station 3 is delivered into the alignment unit 50. In the alignment unit 50, the direction of the wafer W in the horizontal direction is adjusted (process S1 of FIG. 8).

Figure 8:
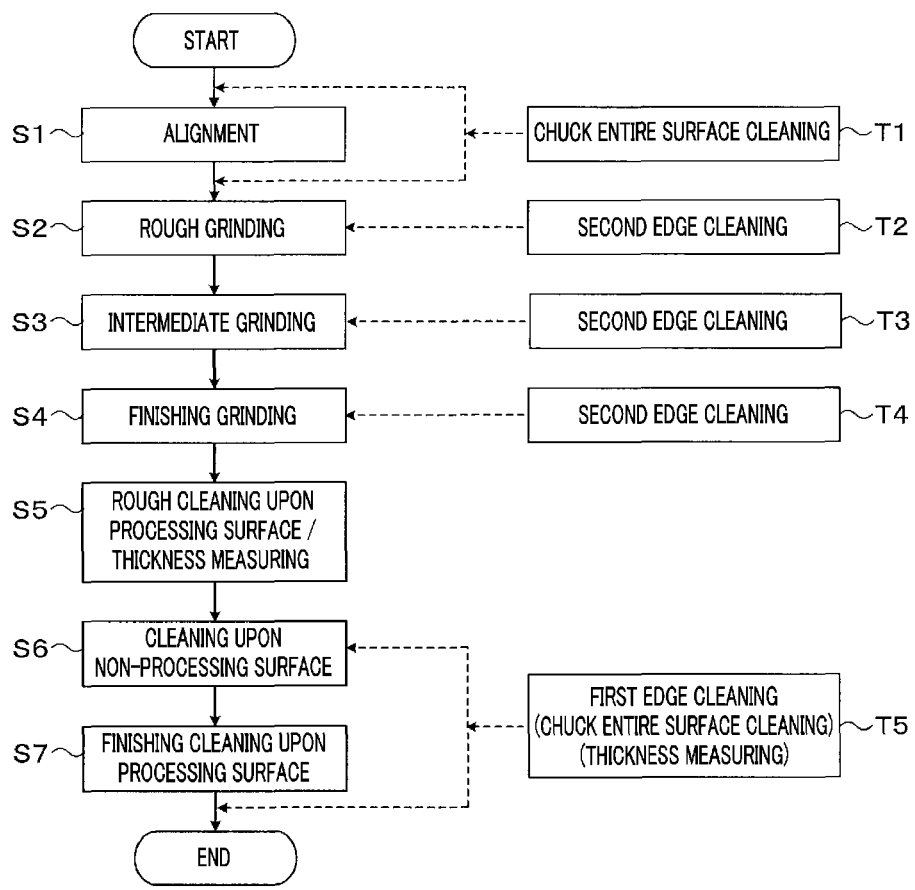
FIG. 8 is a flowchart illustrating main processes of a processing according to the present exemplary embodiment.

At a certain time before the wafer W is held by the substrate holder 31 in a subsequent process S2, that is, when the alignment of the wafer W is performed in the process S1, for example, the substrate holder 31 is cleaned by using the stone cleaning tool 91 of the chuck cleaning unit 90 (process T1 of FIG. 8). In this cleaning of the substrate holder 31, the water and the air from the supply line 35 are blown from the attraction surface of the porous member 32 at the same time.

Subsequently, the wafer W is transferred to the delivery position A0 from the alignment unit 50 by the transfer unit 40, and delivered onto the substrate holder 31 placed at the delivery position A0. Then, the substrate holder 31 is moved to the first processing position A1. The rear surface Wb of the wafer W is roughly ground by the rough grinding unit 110 (process S2 of FIG. 8). At this time, a cleaning liquid is supplied toward a center of the wafer W held by the substrate holder 31 from the wafer cleaning unit 80. In this rough grinding, the cleaning liquid including the grinding debris D produced in the rough grinding reaches the gap between the peripheral portion We of the wafer W and the porous member 32, that is, the edge portion of the substrate holding surface 31a, so that the grinding debris D may be deposited at the edge portion of the substrate holding surface 31a.

Concurrently with the rough grinding of the rear surface Wb of the wafer W, the edge portion of the substrate holding surface 31a is cleaned by the second edge cleaning unit 150 (second edge cleaning). Since the substrate holder 31 holding the wafer W is being rotated by the rotating mechanism 34 at this time, the cleaning liquid including the grinding debris D produced by the rough grinding is removed off the substrate holding surface 31a along the entire circumference thereof (process T2 of FIG. 8).

In this cleaning of the substrate holder 31, the cleaning liquid may be supplied toward the substrate holder 31 from the wafer cleaning unit 80.

Figure 9:
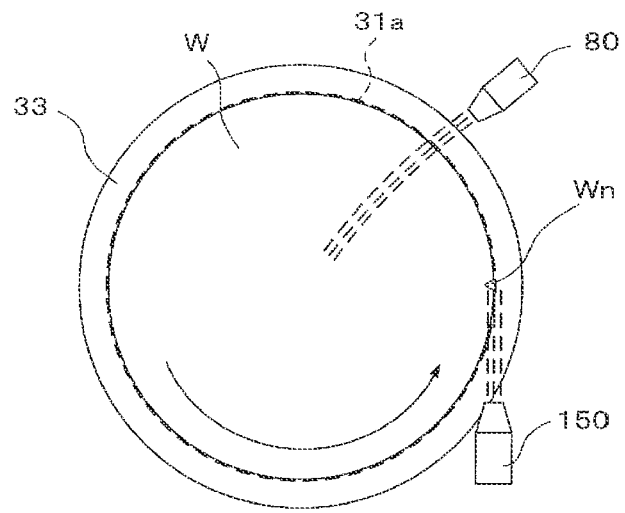
FIG. 9 is an explanatory diagram illustrating an example of a cleaning method by a second edge cleaning unit.

In the cleaning of the edge portion of the substrate holding surface 31a by the second edge cleaning unit 150, it is desirable to supply the cleaning liquid toward a rotation direction of the wafer W held by the substrate holder 31, that is, a tangent direction of the edge portion of the substrate holder 31a as the cleaning target, as illustrated in FIG. 9.

Next, the substrate holder 31 is moved to the second processing position A2. The rear surface Wb of the wafer W is ground to a medium level by the intermediate grinding unit 120 (process S3 of FIG. 8). At this time, the cleaning liquid is supplied toward the center of the wafer W held by the substrate holder 31 from the wafer cleaning unit 80, as illustrated in FIG. 9. In this intermediate grinding, the cleaning liquid including the grinding debris D produced in the intermediate grinding reaches the gap between the peripheral portion We of the wafer W and the porous member 32, that is, the edge portion of the substrate holding surface 31a, resulting in the deposition of the grinding debris D at the edge portion of the substrate holding surface 31a.

Here, concurrently with this intermediate grinding, the edge portion of the substrate holding surface 31a is cleaned by the second edge cleaning unit 150 (second edge cleaning). At this time, since the substrate holder 31 holding the wafer W is rotated by the rotating mechanism 34, the cleaning liquid including the grinding debris D produced by the intermediate grinding is removed off the substrate holding surface 31a along the entire circumference thereof (process T3 of FIG. 8).

Further, in the cleaning of the edge portion of the substrate holding surface 31a by the second edge cleaning unit 150, it is desirable to supply the cleaning liquid toward the rotation direction of the wafer W held by the substrate holder 31, that is, the tangent direction of the edge portion of the substrate holder 31a as the cleaning target, as illustrated in FIG. 9.

Subsequently, the substrate holder 31 is moved to the third cleaning position A3. The rear surface Wb of the wafer W is finely ground by the finishing grinding unit 130 (process S4 of FIG. 8). At this time, the cleaning liquid is supplied toward the center of the wafer W held by the substrate holder 31 from the wafer cleaning unit 80, as illustrated in FIG. 9. In this finishing grinding, the cleaning liquid including the grinding debris D produced in the finishing grinding reaches the gap between the peripheral portion We of the wafer W and the porous member 32, that is, the edge portion of the substrate holding surface 31a, resulting in the deposition of the grinding debris D at the edge portion of the substrate holding surface 31a.

Here, the edge portion of the substrate holding surface 31a is cleaned by the second edge cleaning unit 150 (second edge cleaning). At this time, since the substrate holder 31 holding the wafer W is rotated by the rotating mechanism 34, the cleaning liquid including the grinding debris D produced by the finishing grinding is removed off the substrate holding surface 31a along the entire circumference thereof (process T4 of FIG. 8).

Further, in the cleaning of the edge portion of the substrate holding surface 31a by the second edge cleaning unit 150, it is desirable to supply the cleaning liquid toward the rotation direction of the wafer W held by the substrate holder 31, that is, the tangent direction of the edge portion of the substrate holder 31a as the cleaning target, as illustrated in FIG. 9.

Thereafter, the substrate holder 31 is moved to the delivery position A0. Here, by supplying the cleaning liquid from the wafer cleaning unit 80, the entire rear surface Wb of the wafer W is roughly cleaned (process S5 of FIG. 8). In this process, the cleaning is performed to reduce contamination of the rear surface Wb to some extent.

Concurrently with this rough cleaning, the thickness of the wafer W after being subjected to the grinding processing is measured by the thickness measuring unit 100. To elaborate, a cleaning liquid is supplied to the rear surface Wb of the wafer W by a non-illustrated water supply belonging to the thickness measuring unit 100. At the same time, the thickness of the wafer W is measured by radiating laser for measuring into the cleaning liquid being supplied.

Next, the wafer W is transferred from the delivery position A0 to the second cleaning unit 70 by the transfer unit 40.

In the second cleaning unit 70, the front surface Wa of the wafer W is cleaned and dried in the state that wafer W is held by the transfer pad 42 (process S6 of FIG. 8).

Then, the wafer W is transferred from the second cleaning unit 70 to the first cleaning unit 60 by the transfer unit 40. In the first cleaning unit 60, the rear surface Wb of the wafer W is finely cleaned by the cleaning liquid (process S7 of FIG. 8). In this process, the rear surface Wb is cleaned to a required degree of cleanness, and dried.

At a certain time when the substrate holder 31 is not holding the wafer W after the wafer W is transferred from the delivery position A0 to the second cleaning unit 70 in the aforementioned process S6, that is, after the wafer W is carried out from the substrate holder 31, the edge portion of the substrate holding surface 31a is cleaned by the first edge cleaning unit 140 (first edge cleaning: process T5 of FIG. 8). At this time, by rotating the substrate holding 31 with the rotating mechanism 34, the grinding debris D attached to the edge portion of the substrate holding surface 31a can be washed away along the entire circumference thereof.

Further, in this cleaning of the edge portion of the substrate holding surface 31a, a portion of the edge portion of the substrate holding surface 31a where the notch Wn of the wafer W held by the substrate holder 31 is once located may be mainly cleaned. Accordingly, since the grinding debris D deposited at the portion corresponding to the notch Wn can be cleaned intensively, the deposited grinding debris D can be washed away appropriately.

Furthermore, in this cleaning of the edge portion of the substrate holding surface 31a, entire surface cleaning of the substrate holder 31, that is, the entire surface cleaning of the substrate holder 31 by the chuck cleaning unit 90 may be performed. In this cleaning of the substrate holder 31, while rotating the substrate holder 31 by the rotating mechanism 34, the water and the air from the supply line 35 are blown from the attraction surface of the porous member 32 at the same time. In this way, by performing the entire surface cleaning of the substrate holder 31 while rotating the substrate holder 31, the cleaning liquid contaminated by the cleaning can be suppressed by a centrifugal force from reaching the inside of the porous member 32 of the substrate holding surface 31a. Further, by blowing the wafer and the air from the attraction surface of the porous member 32 as stated above, the contaminated cleaning liquid can be suppressed from reaching the inside of the porous member 32 more appropriately.

Moreover, the entire surface cleaning of the substrate holder 31 may be performed at the same time as the cleaning of the edge portion of the substrate holding surface 31a, or may be performed before or after the cleaning of the edge portion of the substrate holding surface 31a. However, by performing the entire surface cleaning of the substrate holder 31 concurrently with the cleaning of the edge portion of the substrate holding surface 31a, the cleaning liquid contaminated by the cleaning can be appropriately suppressed from reaching the porous member 32 of the substrate holding surface 31a after being cleaned. From this point of view, it is desirable to perform the entire surface cleaning of the substrate holder 31 and the cleaning of the edge portion of the substrate holding surface 31a at the same time.

Afterwards, the wafer W after being subjected to all the required processings is transferred into the cassette Con the cassette placing table 10 by the transfer pad 24 of the wafer transfer device 22. Upon the completion of the series of processings on the single sheet of wafer W, a wafer W as a next processing target is taken out of the cassette C by the transfer fork 23 of the wafer transfer device 22, and the series of processings upon this next wafer W is begun.

Further, in the processings upon the next wafer W, a feedback control for chuck cleaning is performed based on the measurement result upon the previous wafer W obtained by the thickness measuring unit 100. To elaborate, if it is found out by the thickness measuring unit 100 that there is a discrepancy in the thickness of the wafer W within the surface thereof, for example, there is made a determination that the grinding debris D is deposited on the substrate holder 31, and the chuck cleaning is performed by the individual cleaning units to remove the grinding debris D.

Upon the completion of the series of processings upon all the wafers W accommodated in the cassette C, the series of processings in the processing apparatus 1 are ended.

As stated above, in the processing apparatus 1 according to the present exemplary embodiment, the grinding debris D produced by the grinding processing on the wafer W and deposited at the edge portion of the substrate holding surface 31a can be appropriately removed by the first edge cleaning unit 140 after the grinding processing on the wafer W. Accordingly, even if the grinding debris D is deposited at, for example, the edge portion of the wafer holding surface 31a, this grinding debris D can be appropriately washed away, so that the deterioration of TTV can be suppressed.

Further, in the processing apparatus 1 according to the present exemplary embodiment, the grinding debris D produced by the grinding processing can be appropriately removed by the second edge cleaning unit 150 during the grinding processing upon the wafer W. Accordingly, the deposition of the grinding debris D between the peripheral portion We of the wafer W and the porous member 32 can be appropriately suppressed.

To elaborate, as described above, the grinding debris D produced by the grinding processing, specifically, the cleaning liquid including the grinding debris D may reach the edge portion of the substrate holding surface 31a due to the attraction of the wafer W by the porous member 32, and may be easily deposited at, particularly, the portion of the edge portion of the substrate holding surface 31a corresponding to the notch Wn. Here, since the cleaning is performed through the supply of the cleaning liquid by the second edge cleaning unit 150, the grinding debris D at the edge portion of the substrate holding surface 31a and the portion of the notch Wn is washed away by the supplied cleaning liquid, so that the deposition of the grinding debris D can be suppressed.

Moreover, the way how to clean the edge portion of the substrate holding surface 31a by the first edge cleaning unit may be selected as required. For example, the edge portion can be cleaned along the entire circumference thereof by rotating the substrate holder 31 as described above, or the cleaning may be intensively performed on the grinding debris D deposited at the portion corresponding to the notch Wn of the wafer W at least, without rotating the substrate holder 31.

When performing this intensive cleaning upon the grinding debris D deposited at the portion of the notch Wn by the first edge cleaning unit 140 as stated above, the entire surface cleanings of the substrate holder 31 by the chuck cleaning unit 90 and by the water and the air supplied through the supply line 35 are performed at the same time. As a result, the deposited grinding debris D can be removed more appropriately.

In the present exemplary embodiment, the first edge cleaning is performed at the certain time after the process T5, that is, after the wafer W is carried out from the substrate holder 31. However, the timing for the first edge cleaning is not limited thereto. By way of example, the first edge cleaning may be performed at the same time as the process T1 of FIG. 8, that is, the entire surface cleaning of the substrate holder 31 which is performed by the chuck cleaning unit 90 and by the water and the air supplied through the supply line 35.

Further, the cleaning of the edge portion of the substrate holder 31 by the second edge cleaning unit 150 is performed at the same time as the rough grinding, the intermediate grinding and the finishing grinding, respectively, in the present exemplary embodiment. However, the timing for the edge cleaning by the second edge cleaning unit 150 may not be limited thereto, and the edge cleaning may be performed at a certain time other than the grinding processing.

In addition, in the above-described exemplary embodiment, the wafer cleaning unit 80 is controlled to supply the cleaning liquid when the grinding processing upon the wafer W is being performed at each of the processing positions A1 to A3. However, the timing for the supply of the cleaning liquid from the wafer cleaning unit 90 is not limited thereto. By way of example, the cleaning liquid may be supplied toward the porous member 32 of the substrate holder 31 which is not holding the wafer W, after the processing on the wafer W is completed.

Further, the installation position of the wafer cleaning unit 80 is not limited to the one mentioned in the above-described exemplary embodiment. By way of example, the wafer cleaning unit 80 may be configured to be moved by the slider 93, the same as the chuck cleaning unit 90. Further, the wafer cleaning unit 80 may be configured as, for example, a dual-fluid nozzle.

Additionally, in the processing apparatus 1 according to the present exemplary embodiment, the first peripheral cleaning unit 140 and the second edge cleaning unit 150 may be both provided, or at least either of them may be provided. In any cases, since the edge portion of the substrate holding surface 31a where the grinding debris D is highly likely to reach to be deposited can be cleaned intensively, the deposition of the grinding debris D at the corresponding edge portion can be suppressed appropriately, or the deposited grinding debris D, if any, can be removed appropriately.

Moreover, in the above-described exemplary embodiment, the first edge cleaning unit 140 is provided at the delivery position A0 of the processing apparatus 1, and the second edge cleaning unit 150 is provided at each of the processing positions A1 to A3. However, the installation positions of the first edge cleaning unit 140 and the second edge cleaning units 150 are not limited thereto.

By way of example, the first edge cleaning unit 140 may be provided at the slider 93 along with the chuck cleaning unit 90. In this case, it is desirable that the first cleaning unit 140 is configured to be moved in the X-axis direction and the Z-axis direction by a non-illustrated moving mechanism for the first edge cleaning unit 140. As another example, the second edge cleaning unit 150 may be provided at the slider 93.

The number of the second edge cleaning units 150 is not limited to the example of the above-described exemplary embodiment. By way of example, at least one second edge cleaning unit 150 may be provided at any one of the processing positions A1 to A3.

Further, the installation position of the second edge cleaning unit 150 at each of the processing positions A1 to A3 is not limited to the example of the above-described exemplary embodiment. For example, the second edge cleaning unit 150 may be disposed above the edge portion of the substrate holding surface 31a, the same as the first edge cleaning unit 140. Likewise, the first edge cleaning unit 140 may be provided at the outside of the substrate holding surface 31a in the diametrical direction thereof.

Moreover, according to the present exemplary embodiment, the thickness measurement by the thickness measuring unit 100 is performed at the delivery position A0 at the same time as the rough cleaning (process S5 of FIG. 8) upon the wafer W. In this way, by performing the thickness measurement and the cleaning at the same time, a throughput of the processing apparatus 1 can be improved. Further, since a standby time at the third processing position A3 can be shortened, the throughput of the processing apparatus 1 can be improved more appropriately.

Additionally, although the wafer cleaning unit 80 and the thickness measuring unit 100 are provided separately from each other in the above-described exemplary embodiment, the wafer cleaning unit 80 and the thickness measuring unit 100 do not have to be provided separately. For example, they may be a single body, and by using the water supplied from a non-illustrated water supply belonging to the thickness measuring unit 100 as the cleaning liquid, the throughput of the processing apparatus 1 can be further improved.

Further, although the thickness measurement of the wafer W is carried out at the same time as the rough cleaning or the entire surface cleaning of the substrate holder 31, the timing for the thickness measurement of the wafer W is not limited thereto. For example, the thickness measurement of the wafer W may be performed at a certain time before or after these cleaning processings. Since, however, the throughput of the processing apparatus 1 can be improved by performing the thickness measurement of the wafer W and the cleaning at the same time, it is desirable to perform these two processes concurrently.

Furthermore, although the above exemplary embodiment has been described for, for example, the porous chuck capable of attracting and holding wafers W having one and the same diameter, the present disclosure may be applied to a conversion chuck capable of attracting and holding wafers W having different diameters (for example, a wafer W of ϕ200 mm and a wafer W of ϕ300 mm).

Figure 10:
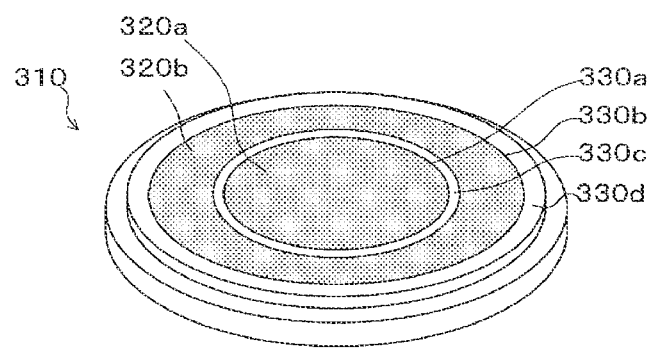
FIG. 10 is a perspective view schematically illustrating another configuration of the substrate holder.

FIG. 10 is a perspective view illustrating a schematic configuration of a conversion chuck 310. As depicted in FIG. 10, the conversion chuck 310 includes a porous member 320 as a substrate attracting member; and a chuck base 330 as a supporting member configured to support the porous member 320.

The porous member 320 has a substantially disk-shaped central zone 320a for attracting and holding the front surface Wa of the wafer W of, e.g., ϕ200 mm on a top surface thereof; and a substantially ring-shaped peripheral zone 320b for attracting the front surface Wa of the wafer W of, e.g., ϕ300 mm on a top surface thereof as well as on the central zone 320a. That is, only the central zone 320a serves as a substrate holding surface 310a when processing the wafer W of ϕ200 mm in the processing apparatus 1, whereas the central zone 320a and the peripheral zone 320b serve as the substrate holding surface 310a together when processing the wafer W of ϕ300 mm. Further, the central zone 320a and the peripheral zone 320b are supported on the chuck base 330 with a partition member 330c of the chuck base 330 to be described later therebetween.

The chuck base 330 is configured to support the porous member 320 from below it, and a central hole 330a for accommodating the central zone 320a of the porous member 320 and a peripheral hole 330b for accommodating the peripheral zone 320b are formed on a top surface of the chuck base 330 with the partition member 330c therebetween. Further, the chuck base 330 has a diameter larger than the peripheral zone 320b of the porous member 320, and a non-attraction zone 330d is formed at an outside of the peripheral hole 330b in a diametrical direction (an outside of the peripheral zone 320b in the diametrical direction). Further, the chuck base 330 is made of, by way of non-limiting example, ceramic.

Further, the top surfaces of the porous member 320 and the chuck base 330 are configured to be on the same plane in the state that the central zone 320a and the peripheral zone 320b of the porous member 320 are fitted in the central hole 330a and the peripheral hole 330b, respectively.

When using the conversion chuck 310 having the above-described configuration, in the first edge cleaning unit 140 and the second edge cleaning unit 150, an edge portion of the central zone 320a is cleaned after the grinding of the wafer W of, e.g., ϕ200 mm whereas an edge portion of the peripheral zone 320b is cleaned after the grinding of the wafer W of ϕ300 mm.

Further, when processing the wafers W having the different diameters (for example, the wafers W of ϕ200 mm and ϕ300 mm), the first edge cleaning unit 140 and the second edge cleaning unit 150 may be configured to be movable along these wafers W. That is, the first edge cleaning unit 140 and the second edge cleaning unit 150 may be configured to be moved on the substrate holder 31 in the diametrical direction by non-illustrated moving mechanisms.

Configuration of Processing Apparatus According to Another Exemplary Embodiment

Figure 11:
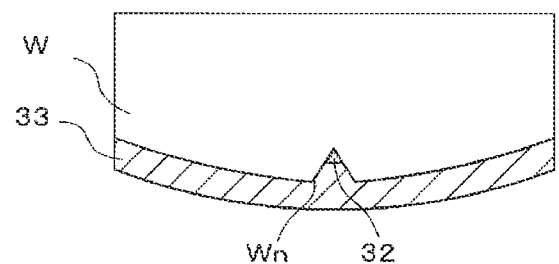
FIG. 11 is an explanatory diagram for describing a reason for TTV deterioration in the processing apparatus.

As stated above, due to the attraction of the wafer W by the porous member 32, there is a likelihood that the grinding debris D produced in the grinding processing by the processing apparatus 1 may reach the edge portion of the substrate holding surface 31a to be deposited at the portion corresponding to the notch Wn. As a result, TTV in the grinding processing may be deteriorated. Here, depending on transfer accuracy or alignment accuracy of the wafer W, the porous member 32 may be exposed at the portion where the notch Wn is formed, when viewed from the top, as illustrated in FIG. 11. If the porous member 32 is exposed, the grinding debris D may be attracted to the exposed portion of the porous member 32 actively, so that the grinding debris D may be easily deposited at the portion corresponding to the notch Wn.

In the substrate holder according to the present exemplary embodiment, however, the attraction of the wafer W by the porous member 32 is not performed at the position corresponding to the notch Wn, when viewed from the top.

Figure 12A:
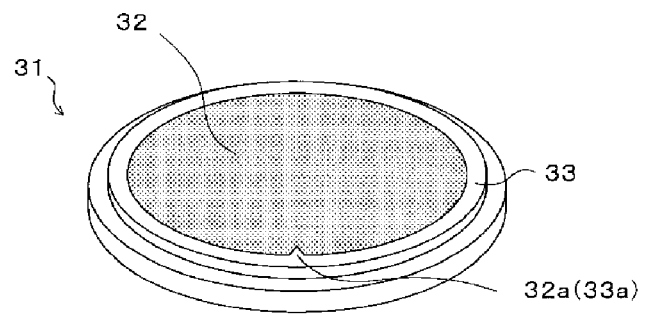
FIG. 12A and FIG. 12B are a perspective view and a partially enlarged view illustrating a schematic configuration of a substrate holder according to another exemplary embodiment.

To elaborate, as shown in FIG. 12A, formed at the porous member 32 of the substrate holder 31 is a cutoff portion 32a corresponding to the notch Wn of the wafer W when the wafer W is attracted to and held by the substrate holder 31, when viewed from the top.

Further, a protrusion 33a is formed at a portion of the chuck base 33 corresponding to the cutoff portion 32a. Accordingly, on the substrate holder 31 having the cutoff portion 32a, the attracting/holding of the wafer W is not performed.

According to the present exemplary embodiment, by forming the cutoff portion 32a at the portion of the porous member 32 corresponding to the notch Wn, it does not happen that the porous member 32 is exposed when viewed from the top. Thus, the active attraction of the grinding debris D can be suppressed. Accordingly, the deposition of the grinding debris D at the portion corresponding to the notch Wn can be suppressed.

Further, by suppressing the deposition of the grinding debris D as stated above, the grinding debris D can be easily removed through the entire surface cleaning processing which is performed by the chuck cleaning unit 90 and the water/the air supplied from the supply line 35. Then, by further performing the edge cleaning further by the first edge cleaning unit 140 or the second edge cleaning unit 150, the grinding debris D can be removed more appropriately.

In addition, the position adjustment of the notch Wn of the wafer W and the cutoff portion 32a according to the present exemplary embodiment is carried out by the alignment unit 50. That is, in the present exemplary embodiment, the position adjustment of the wafer W in the horizontal direction is performed in the above-described process S1. When this position adjustment is performed, the position of the notch Wn is adjusted to be the same as that of the cutoff portion 32a. The wafer W after being subjected to this position adjustment is then transferred to the delivery position A0 in the above-described process S2, and delivered onto the substrate holder 31 at the delivery position A0 such that the cutoff portion 32a and the notch Wn correspond to each other in a circumferential direction.

Figure 12B:
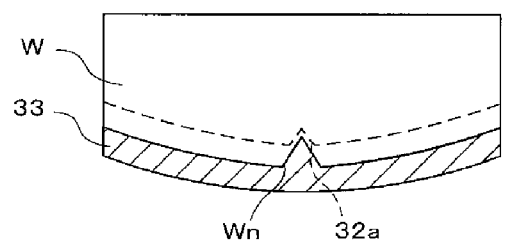
Figure 13:
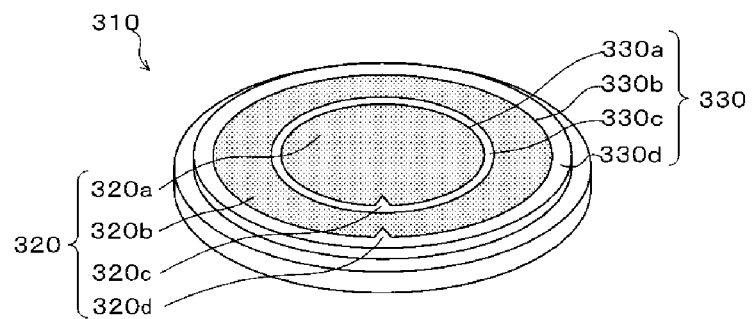
FIG. 13 is a perspective view schematically illustrating another configuration of the substrate holder according to the another exemplary embodiment.

Desirably, the cutoff portion 32a formed at the porous member 32 is larger than the notch Wn of the wafer W, when viewed from the top, as illustrated in FIG. 12B. To be specific, by forming the cutoff portion 32a to have a size equal to or larger than a tolerable error for the position adjustment performed in the alignment unit 50 at least, the deposition of the grinding debris S at the portion corresponding to the notch Wn can be suppressed more appropriately.

Furthermore, in case of using the aforementioned conversion chuck 310 as a substrate holder and forming cutoff portions at the conversion chuck 310, a cutoff portion 320c corresponding to a wafer W of ϕ200 mm and a cutoff portion 320d corresponding to a wafer W of ϕ300 mm may be formed at the central zone 320a and the peripheral zone 320b, respectively.

Processing Method According to Another Exemplary Embodiment

Further, a direction of the wafer W, which is held by the substrate holder 31, in the horizontal direction may be changed for every single sheet of wafer W to be processed.

Figure 14:
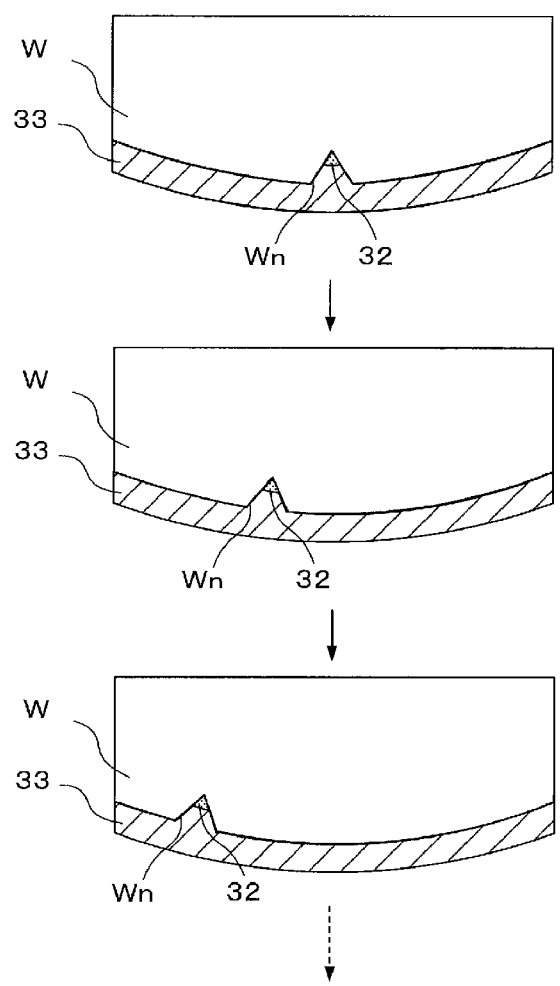
FIG. 14 is an explanatory diagram schematically illustrating how to hold a wafer in a processing method according to the another exemplary embodiment.

FIG. 14 is an explanatory diagram schematically illustrating a processing method according to the present exemplary embodiment.

As depicted in FIG. 14, in the processing method according to the present exemplary embodiment, positions (angle) of a plurality of wafers W in the horizontal direction when the wafers W to be processed in the processing apparatus 1 in sequence are held by the substrate holder 31 are changed for each of the wafers W. That is, the position alignments are performed by the alignment unit 50 such that positions of notches Wn of the plurality of wafers W processed in sequence are not overlapped, when viewed from the top.

As described earlier, the grinding debris D produced in the grinding processing may be easily deposited at the portion corresponding to the notch Wn. An influence of the deposition of this grinding debris D becomes conspicuous when the directions of the plurality of wafers W processed in sequence are coincident in the horizontal direction. That is, if the positions of the notches Wn of the plurality of wafers W are coincident in the horizontal direction, the grinding debris D may be repeatedly deposited on the same position. In such a case, the grinding debris D may not be removed sufficiently in the entire surface cleaning of the substrate holder 31 which is conventionally performed by using the chuck cleaning unit 90 and the water/air supplied through the supply line 35.

Thus, as in the grinding method according to the present exemplary embodiment, by changing, for each of the plurality of wafers W, the position corresponding to the notch Wn of the wafer W, that is, the position where the grinding debris D is deposited, the removing of the grinding debris D through the entire surface cleaning by the chuck cleaning unit 90 and the water/air supplied through the supply line 35 can be carried out more efficiently. Thus, the deterioration of TTV in the processing can be suppressed appropriately.

At this time, by further performing the edge cleaning by the first edge cleaning unit 140 and the second edge cleaning unit 150, the grinding debris D deposited at the portion corresponding to the notch Wn can be removed more appropriately, so that the deterioration of TTV can be suppressed more appropriately.

Moreover, the positions of the notches Wn of the plurality of wafers W may be distributed in the circumferential direction, based on the measurement result of the thickness measuring unit 100. That is, in case that TTV is locally deteriorated due to the deposition of the grinding debris D, TTV of a next wafer W can be improved by setting the notch Wn of this next wafer W to be located at an opposite side, in the diametrical direction, to where the deterioration of TTV has occurred, for example.

Additionally, the changing of the position in the horizontal direction at the time when the wafers W are held on the substrate holder 31 may not be limited to being performed only when the wafers W are processed in sequence, but also be applied to a case where the wafers W are processed one by one. In this case as well, the positions of the grinding debris D deposited at the portion corresponding to the notch Wn can be distributed, so that the deterioration of TTV in the processing can be suppressed more appropriately.

It should be noted that the exemplary embodiment is illustrative in all aspects and is not anyway limiting. The above-described exemplary embodiment may be omitted, replaced and modified in various ways without departing from the scope and the spirit of claims.

By way of example, the wafer W to be ground in the processing apparatus 1 may be, for example, a combined wafer including a support wafer boned thereto, and edge trimming may be performed on the wafer W as the processing target. In such a case, a position adjustment of the wafer W in a horizontal direction is performed by referring to a notch formed at the support wafer, and a grinding debris D deposited at a portion corresponding to the notch formed at the support wafer is removed by a cleaning apparatus.

According to the exemplary embodiments, it is possible to remove the grinding debris deposited on the substrate holding surface appropriately, thus improving the in-surface uniformity of the thickness of the substrate after being processed.

I claim:

1. A processing method of processing a substrate, comprising:

grinding the substrate while the substrate is attracted to and held by a substrate holding surface of a substrate holder, wherein the substrate holder includes a porous member serving as a substrate attracting member and a chuck base configured to support the porous member from below; and simultaneously cleaning both of an entire surface of the substrate holder by supplying water from the porous member of the substrate holder and an edge portion of the substrate holding surface by an edge cleaning unit, after the substrate held by the substrate holder is carried out from the substrate holder, wherein the substrate holder is connected to a liquid supply line configured to supply water to the porous member.

2. The processing method of claim 1, wherein a notch is formed at a peripheral portion of the substrate, and the substrate holder is configured to hold the substrate such that the notch and a cutoff portion formed at the substrate holding surface correspond to each other when viewed from top.

3. The processing method of claim 1, wherein a notch is formed at a peripheral portion of the substrate, and in the cleaning of the edge portion of the substrate holding surface, a portion of the edge portion corresponding to the notch is cleaned.

4. The processing method of claim 1, further comprising:

adjusting a position of the substrate in a circumferential direction, wherein the substrate includes multiple substrates and a notch is formed at a peripheral portion of each substrate, and in the grinding of the multiple substrates, the positions of the substrates in the circumferential direction are adjusted such that the notches are not overlapped on the substrate holding surface when viewed from top.

5. The processing method of claim 1, wherein in the cleaning of the entire surface of the substrate holder, while rotating the substrate holder, water and air are blown from a porous member of the substrate holder at the same time.

6. The processing method of claim 1, further comprising:

cleaning, by a wafer cleaning unit, a surface of the substrate held by the substrate holder.

7. A processing method of processing a substrate, comprising:

grinding the substrate while the substrate is attracted to and held by a substrate holding surface of a substrate holder that is placed at a processing position, wherein the substrate holder includes a porous member serving as a substrate attracting member and a chuck base configured to support the porous member from below;

moving the substrate holder holding thereon the substrate to a delivery position from the processing position;

cleaning, by a wafer cleaning unit, a surface of the substrate held by the substrate holder that is placed at the delivery position;

moving the substrate away from the substrate holder at the delivery position; and simultaneously cleaning both of an entire surface of the substrate holder by supplying water from the porous member of the substrate holder, and an edge portion of the substrate holding surface by an edge cleaning unit, after the substrate held by the substrate holder is carried out from the substrate holder, wherein the substrate holder is connected to a liquid supply line configured to supply water to the porous member.

* * * * *